(12) United States Patent     (10) Patent No.: US 6,855,964 B2
Hulfachor     (45) Date of Patent: Feb. 15, 2005

(54) TRIGGERING OF AN ESD NMOS THROUGH THE USE OF AN N-TYPE BURIED LAYER

(75) Inventor: Ronald B. Hulfachor, Cape Elizabeth, ME (US)

(73) Assignee: Farichild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/280,313

(22) Filed: Oct. 25, 2002

(65) Prior Publication Data

US 2003/0085429 A1 May 8, 2003

Related U.S. Application Data

(60) Provisional application No. 60/335,912, filed on Nov. 2, 2001.

(51) Int. Cl.[7] ............................................. H01L 21/8234
(52) U.S. Cl. ..................... 257/173; 257/355; 257/356; 257/360
(58) Field of Search ................ 257/173, 355–363; 361/56

(56) References Cited

U.S. PATENT DOCUMENTS

| | | | |
|---|---|---|---|
| 5,019,888 A | * | 5/1991 | Scott et al. .................. 257/698 |
| 5,870,268 A | | 2/1999 | Lin et al. |
| 5,932,914 A | | 8/1999 | Horiguchi |
| 6,063,672 A | | 5/2000 | Miller et al. |

2001/0053054 A1 * 12/2001 Andoh ........................ 361/56

OTHER PUBLICATIONS

Notification of Transmittal of the International Search Report, dated Apr. 1, 2003.

* cited by examiner

*Primary Examiner*—Minhloan Tran
*Assistant Examiner*—Thomas L. Dickey
(74) *Attorney, Agent, or Firm*—Cesari and McKenna, LLP.; Edwin H. Paul, Esq.

(57) ABSTRACT

An ESD NMOS structure with an odd number of N-type structures built into a P-type well. Buried N-type structures are positioned between the N-type structures. The center N-type structure and each alternate N-type structure are electrically connected to each other, to the buried N-type structures, and to the output contact; while the other N-type structures are electrically connected to each other and the P-well and to ground. When a positive ESD event occurs, a depletion zone is created in the P-well between the N-type buried structures and the N-type structures thereby increasing the resistivity of the structure. Moreover, when a positive ESD event occurs, the lateral NPN transistors on either side of the center N-type structure break down and snap back. The resulting current travels through the area of increased resistivity and thereby creates a larger voltage along the P-well from the center N-type structure out toward the distal N-type structures. The combination of the increased resistivity and the higher voltage act in combination to lower the triggering voltage of the ESD structure.

5 Claims, 2 Drawing Sheets

TRIGGERING OF AN ESD NMOS THROUGH THE USE OF AN N-TYPE BURIED LAYER

CROSS-REFERENCE TO RELATED APPLICATIONS

The present application claims the benefit of U.S. Provisional Patent Application Ser. No. 60/335,912, which was filed on Nov. 2, 2001 by the same inventor and title as the present application, and which provisional application is hereby incorporated herein by reference.

FIELD OF THE INVENTION

The present invention relates to protection of circuitry from electrostatic discharges (ESD's), and more particularly to enhancing the triggering of ESD protection devices resident on or near integrated circuits (IC) that are designed to protect the chip circuitry.

BACKGROUND INFORMATION

Electrostatic discharges occur naturally, e.g. by walking on a rug, and, although often have little energy, high voltages may occur. As it happens IC's are very susceptible to harm simply by voltage levels alone. For example, dielectric layers and/or other such isolation barriers may be damaged or destroyed, by the voltage alone. Moreover, voltage levels of a few volts above typical Vcc levels may harm modern IC's. There is a need to have ESD devices built onto IC chips that reliably trigger at fairly low levels.

There have been many suggestions of ways to lower the ESD triggering voltages. One such suggestion is found in U.S. Pat. No. 5,870,268 to Lin et al. This patent teaches generating, in response to an ESD event, a current spike that drives up the voltage of the p-well surrounding the ESD device. The higher P-well voltage lowers the trigger voltage of the ESD NMOS device down to the 12 volt level or so. This approach requires added circuitry, however.

Another patent, U.S. Pat. No. 5,932,914 discloses another approach using N-wells and an N type buried diffusion layer (NBL). The patent teaches forming, within the N type material envelope, an NPN protection transistor, and an NMOSFET protection device separated by a resistor. The patent claims the combination provides an improved ESD protection mechanism. The NBL participates in the formation of the NPN and the NMOS, but there is no disclosure of lowering and/or improving trigger levels. However, this N type material completely envelops the P-well carrying the ESD device and, thus, occupies more IC surface area than the ESD device itself would occupy.

There still is a need for a simple IC structure that provides a low ESD trigger level reliably without extensive overhead circuitry and with an efficient use of IC space.

SUMMARY

In view of the foregoing discussion the present invention provides for a reliable low trigger voltage level of an ESD NMOS device without the complex circuitry of the prior art. The EDS NMOS device has an output contact meant to be electrically connected to a circuit to be protected. A P-type well is formed and at least two but preferably an odd number of N-type structures are diffused or otherwise formed in the P-type well. Substantially bridging the gaps between the N-type structures are N-type buried layers. But, these buried layers are formed along the gaps with openings opposite the N-type structures themselves. Gate structures of poly-silicon or metalization as known in the art are formed over the N-type structure, electrically insulated therefrom, with the gate structures substantially bridging the gaps between the N-type structures.

The effect is to increase the resistivity of the P-type well by creating a depletion zone in the presence of a positive ESD event and the increase the voltage of the P-well as current travels through the lateral NPN transistors that have broken down in a snap-back manner, both act to lower the ESD trigger voltage.

The present invention can be advantageously applied to virtually any logic circuitry that may be found in computer system (both large server types or small PC types), communication systems, including the Internet and local networks, display systems, memory and mass memory systems, power supplies.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
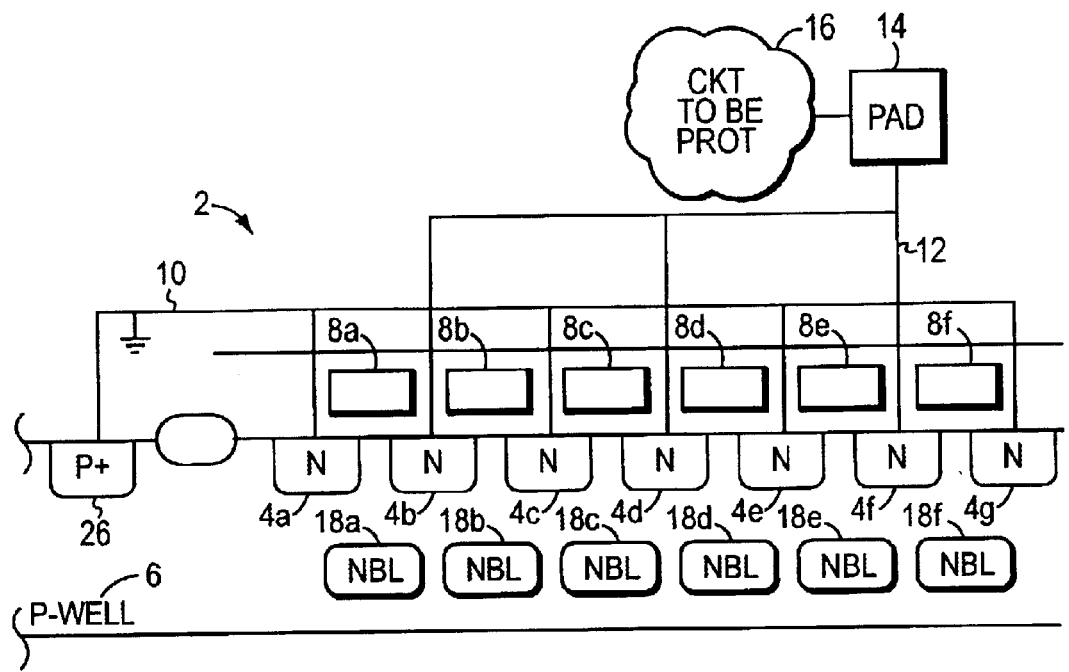
FIG. 1 is a cross section of a device incorporating the present invention.

FIG. 1 shows a functional pictorial of an IC structure 2 made in accordance with the present invention. The drawing elements are meant for understanding and not to illustrate monolithic IC fabrication techniques or actual IC structures. However, it is well known in the art to build such ICs in accordance with the present invention with known IC fabrication structures and techniques. The electrical contacts, discussed below, are shown schematically in FIG. 1, but structures to form these electrical contacts are well known in the art.

Multiple N-type structures 4a, 4b, 4c, 4d, 4e, 4f and 4g are diffused into a P-well 6. Gate fingers 8a, 8b, 8c, 8d, 8e and 8f bridge the spaces between the N diffusions. In this particular structure the N diffusions 4a, 4c, 4e and 4g are electrically connected together 10 and connected to ground. These connections form the source of an ESD protective NMOSFET device. The N diffusions 4b, 4d and 4e form the drain. The drains are electrically connected together 12 and are connected to a pad 14 that leads to the circuitry 16 that is being protected. Directly beneath each gate there are N-type buried layers (NBL's) 18a, 18b, 18c, 18d, 18e and 18f. These NBL's are electrically connected together and to the pad 14.

Figure 2:
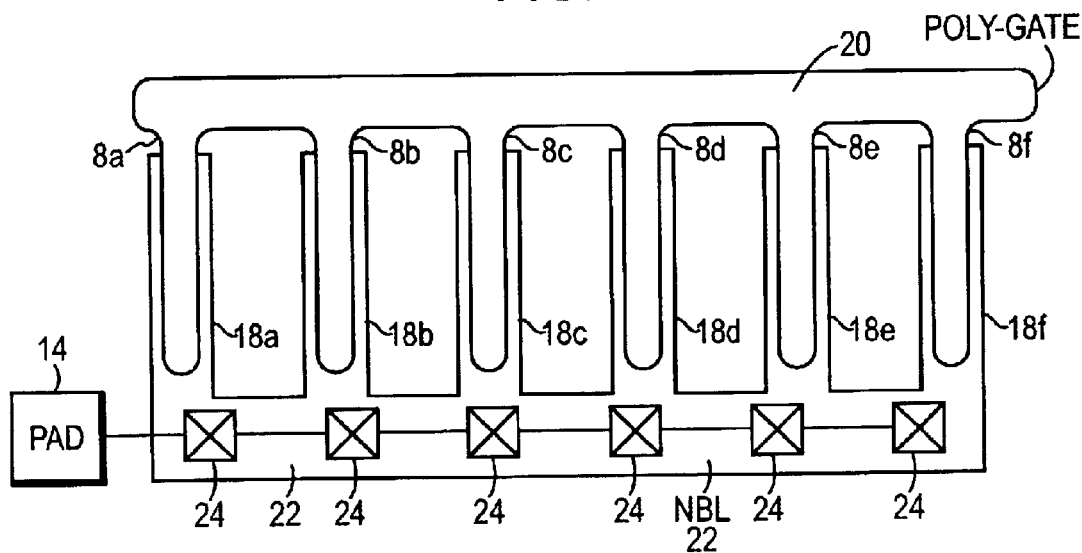
FIG. 2 is top view of the device of FIG. 1.

FIG. 2 shows the structure of FIG. 1 from the top. The gate electrical contact 20 extends and electrically joins the gate fingers 8a–8f. Beneath each gate finger is one of the NBL's, 18a–18f, which may be electrically joined by an NBL 22. Electrical contacts 24 are brought to the surface through a vertical N-type tap created from the N-type buried layer, and N well (and/or sinker), N+ S/D, and contact.

The structure shown in FIGS. 1 and 2 operates to lower and thereby improve the ESD device triggering threshold in a manner as follows. This discussion presumes that the ESD event will occur at the pad 14 with respect to ground.

Figure 3:
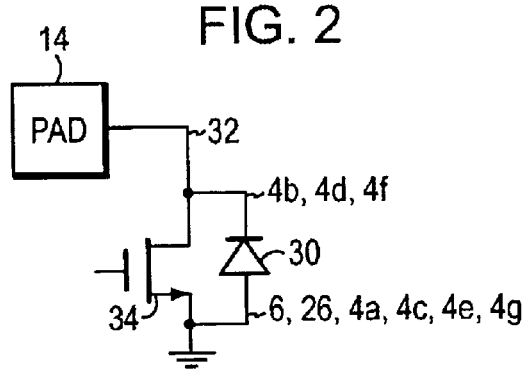
FIG. 3 is schematic of an ESD NMOS device.

In FIG. 1 there is a P-type diffusion 26 and an electrical connection joining the P-well to ground. If the ESD event is a negative going voltage pulse at the pad 14, the pad voltage will travel below ground. Note that the N-type drain diffusions are connected 12 to the pad 14 and also form the cathode (4b, 4d, 4e and 4f) of a diode. FIG. 3 shows this diode 30 for an NMOSFET. The anode 6 of the diode is the P-well and the contact 26 to ground. This is the well known diode that joins the source to the drain in NMOSFET's. When the negative ESD event occurs this diode is forward biased and restricts the negative voltage swing at the pad to about 0.8 volts (for silicon). In this situation it is important to note that the NBL's are finger-like strips and not a full blanket-type buried layer. The finger-like strips will not screen or shield the drain from being the cathodes and receiving large currents from the source.

Figure 4:
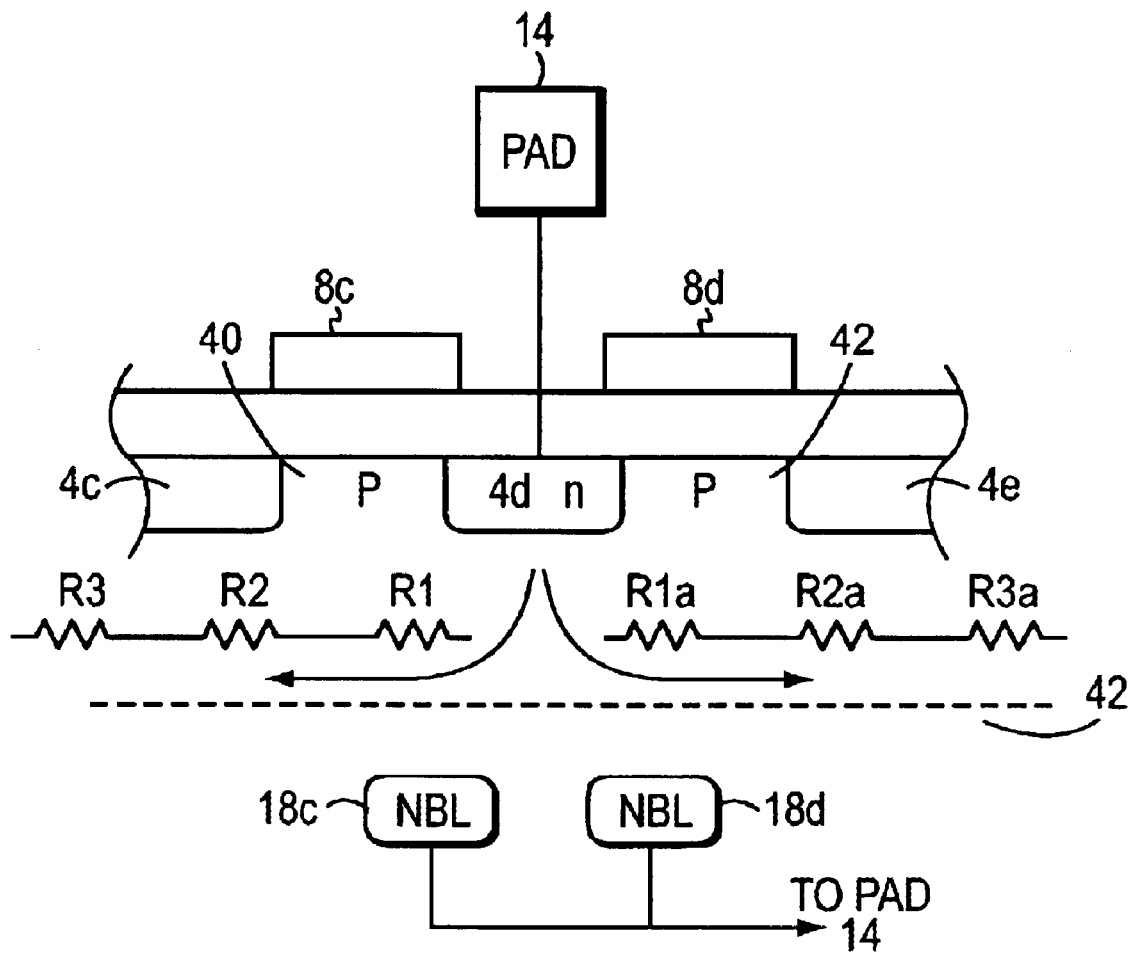
FIG. 4 is a detail of the device in FIG. 1, near the center.

For positive going ESD events, the pad 14 will be going higher than ground. FIG. 4 shows the center section of FIG. 1. Notice that there are source diffusions 4a and 4g at the far left and right edges, respectively, of the device in FIG. 1. The triggering action sends charge carriers, inter alia, from the center drain 4d toward the sources 4a and 4g at the distal edges of the device. Here the gates 8c and 8d bridge the gaps between the N-type diffusions 4c and 4d, and between 4d and 4e. The NBL's 18c and 18d lie under the gates 8c and 8d and are electrically connected to the pad 14. The drain 4d and the other drain connections are also connected to the pad 14. The source 4c and 4e and the P-well 6 are connected to ground. Notice that there are lateral NPN transistors formed with the P-well base, N diffusion 4d as a common collector, and N diffusions 4c and 4e the emitters. The NPN transistors are formed in opposite directions. When the ESD protection device triggers, sometimes called "snapback," due to a positive ESD event on the pad, there will be a low conduction path from the drain diffusions to the source diffusion (32 to 34 in FIG. 3) that acts to limit the voltage of any ESD event occurring at the pad 14. The NPN transistors break down collector to emitter in this instance. The conduction will, in this preferred embodiment run from the center 4d toward the two edges 4a and 4g. It is known that the voltage threshold or triggering point where this "snap-back" occurs is reduced as the resistivity of the P-well increases. Since the voltage levels of the NBL 18c and 18d rise in response to a positive ESD event, the diode formed by the P-well and the NBL's will reverse bias creating a depletion zone 42 that infringes into the P-well and reduces or pinches off the P-well effective volume. This effectively increases proportionally the effective P-well resistivity and as mentioned above reduces the triggering voltage of the ESD device.

Another effect operates to lower the triggering threshold in the present invention. This effect is known as the "floating well" effect. It is known that if the P-well voltage rises locally under the gates, the trigger voltage of the ESD NMOS device is decreased.

With reference to FIG. 4, as the depletion zones 42 increases, thereby increasing the resistivity as discussed above, any charge carriers 46, 48 travelling from the center of the device encounters the increased resistivity in the P-well and, thereby, increases the local voltage in the P-well. The highest voltage occurs near the center drain 4d. This enhances the "floating" effect.

That is the two effects of resistivity increases due to the depletion effect enhanced by the NBL, and the increase in voltage of the P-well due to the increased resistance to the charge carriers as they drift through the P-well both act in concert to decrease the ESD device triggering voltage and therefore improve the protection capability. Virtually any electronic, logic or other such circuitry, CKT, may be protected from ESD events using the present invention as described above. Circuits that lead off a local system to other systems, e.g. communications connections to modems or telephone systems or to remote displays, keyboards, power supplies, memory, etc. may be more susceptible to damage from ESD events, as compared to circuitry that remains internal to an assembly or printed circuit board. However, any circuitry may be protected by the present invention.

What is claimed is:

1. An EDS NMOS device defining an output contact to a circuit to be protected, the device comprising:

a P-type well, a series of N-type structures formed in the P-type well, the series divided into a first group of alternates and a second group of alternates, an N-type buried structure proximate, but not touching, the series of N-type structures, the first group of alternates of the N-type structures electrically connected to each other, the second group of alternates of the N-type structures electrically connected to each other, a first electrical connection from the output contact to the first group of alternates of theN-type structures, and a second electrical connection from the second group of the N-type structures to the P-type well and to a ground connection.

2. The device of claim 1 further comprising N-type buried structures substantially bridging the gaps between each adjacent N-type structure.

3. The device of claim 1 further comprising gate structures built on top of, but electrically insulated from, the series of N-type structures, the gate structures substantially bridging the gap between each of the adjacent N-type structures, and wherein the gates structures are floating.

4. The device of claim 1 wherein there is an odd number of N-type structures with the center N-type structure electrically connected to the output contact.

5. An electronic system selected from the group consisting of computer processing systems, communications system, display systems, memory systems; the group having circuitry susceptible to damage from ESD events, a device with an output contact connected to the circuitry susceptible to damage, the device comprising:

a P-type well, a series of N-type structures formed in the P-type well, the series of N-type structures divided into a first group of alternates and a second group of alternates, a N-type buried structure proximate, but not touching, the series of N-type structures, a first electrical connection from the output contact the first group of alternates, and a second electrical connection from the second group of alternates to the P-type well and to a ground connection.

* * * * *